United States Patent
Tien

(10) Patent No.: US 6,221,785 B1
(45) Date of Patent: Apr. 24, 2001

(54) METHOD FOR FORMING SHALLOW TRENCH ISOLATIONS

(75) Inventor: Yu-Chung Tien, Hsinchu (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 09/154,778

(22) Filed: Sep. 17, 1998

(51) Int. Cl.⁷ .................................................. H01L 21/304
(52) U.S. Cl. ........................ 438/745; 438/747; 438/750; 438/756; 438/757
(58) Field of Search ..................................... 438/745, 756, 438/424, 435, 747, 296, 401, 432, 757, 706, 723, 724, 750

(56) References Cited

U.S. PATENT DOCUMENTS

| | | | |
|---|---|---|---|
| 5,447,884 | * 9/1995 | Fahey et al. | 438/437 |
| 5,492,858 | * 2/1996 | Bose et al. | 438/437 |
| 5,515,950 | * 5/1996 | Ibok et al. | 438/435 |
| 5,674,775 | * 10/1997 | Ho et al. | 438/296 |
| 5,702,976 | * 12/1997 | Schuegraf et al. | 438/424 |
| 5,872,045 | * 2/1999 | Lou et al. | 438/432 |
| 5,893,744 | * 4/1999 | Wang | 438/401 |
| 5,963,816 | * 10/1999 | Wang et al. | 438/401 |

* cited by examiner

Primary Examiner—Benjamin L. Utech
Assistant Examiner—Binh X Tran
(74) Attorney, Agent, or Firm—Finnegan, Henderson, Farabow, Garrett & Dunner, L.L.P.

(57) ABSTRACT

A method for forming shallow trench isolations includes the steps of defining a wafer substrate, forming a silicon dioxide insulating layer on the substrate, depositing a silicon nitride layer on the silicon dioxide insulating layer, and forming at least one trench in the substrate through the silicon dioxide and silicon nitride layers. The method also includes the steps of depositing a silicon dioxide layer over the silicon nitride layer and in the trench, removing the silicon dioxide layer deposited over the silicon nitride layer, anisotropically etching the silicon dioxide layer to produce silicon dioxide sidewalls in the trench contiguous with the silicon nitride layer, isotropically etching to remove the sidewalls and removing the silicon nitride layer.

7 Claims, 3 Drawing Sheets

METHOD FOR FORMING SHALLOW TRENCH ISOLATIONS

BACKGROUND OF THE INVENTION

1. Field of the Invention

This invention pertains in general to shallow trench isolations in a semiconductor device and, more particularly, to a method of forming substantially planar shallow trench isolations.

2. Description of the Related Art

Shallow trench isolations ("STIs") are used for device isolation in an integrated circuit. A conventional process of forming STIs begins by defining a wafer substrate. An insulating layer of silicon dioxide is then grown over the substrate, followed by depositing a layer of silicon nitride over the insulating layer. After shallow trenches are patterned and formed in the device substrate and through the insulating layer and the silicon nitride layer, silicon dioxide is deposited, filling the trenches and in the process forming a layer over the silicon nitride layer. Silicon dioxide deposited over the silicon nitride layer is removed, usually with chemicalmechanical polishing ("CMP"), to obtain a substantially planar surface.

However, the silicon dioxide layer, deposited by a conventional low pressure chemical vapor deposition ("LPCVD") technique, is often thicker at the wafer edge, or "bowl-shaped." As a result, the CMP process that leaves a substantially planar surface would also leave silicon dioxide residues over the silicon nitride layer at the wafer edge. If the residues are not removed, they act as a mask and prevent subsequent removal of the silicon nitride layer. If, however, the wafer is intentionally over-polished during the CMP process to remove the silicon dioxide at the wafer edge, the STIs closer to the center of the wafer will become bowl-shaped, i.e., nonplanar, which may impede subsequent STI formation process steps.

The process continues by etching back the silicon dioxide in the trenches using a buffered oxide etch ("BOE"), a type of isotropic etching, to yield a planar surface. The silicon nitride layer serves as an etch stop for the BOE. This is followed by the removal of the silicon nitride layer with hot phosphoric acid $H_3PO_4$.

This conventional STI formation process, however, often leaves microtrenches that result in nonplanarity of the oxide surface, at the interface between the silicon dioxide in the trenches and the device substrate. The micro-trenches present an impediment to subsequent device formation processes. The formation of microtrenches is largely due to the BOE that leaves undesired micro-trenches between the etched material and etch-stop. When the etch-stop, i.e., silicon nitride, is stripped, the micro-trenches remain.

FIG. 1 illustrates the resulting structure. Referring to FIG. 1, micro-trenches 2 are formed at the interface between silicon substrate 4 and silicon dioxide 6 in shallow trenches 8.

SUMMARY OF THE INVENTION

Accordingly, the present invention is directed to a method of forming a planar shallow trench isolation structure that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structures and methods particularly pointed out in the written description and claims hereof, as well as the appended drawings.

To achieve these and other advantages, and in accordance with the purpose of the invention as embodied and broadly described, there is provided a method for forming planar shallow trench isolations in a wafer substrate having a silicon dioxide insulating layer disposed over the substrate and a silicon nitride layer disposed over the silicon dioxide insulating layer to form a substrate-insulator-silicon nitride stack. A surface of the substrate-insulator-silicon nitride stack is planar and has a plurality of trenches filled with silicon dioxide. The method includes the steps of anisotropically etching the silicon dioxide layer to produce in the trenches silicon dioxide having sidewalls contiguous with the silicon nitride layer, and isotropically etching to remove the silicon dioxide sidewalls such that the silicon dioxide in the trenches is planar with the silicon dioxide insulating layer.

In another aspect, the step of isotropically etching includes a step of performing a buffered oxide etch.

In yet another aspect, the step of anisotropically etching includes a step of etching with faster etch rate at the edge of the wafer.

Also in accordance with the invention, there is provided a method for forming shallow trench isolations. The method includes the steps of defining a wafer substrate, forming a first insulating layer on the substrate, and depositing a second insulating layer on the first insulating layer wherein the first insulating layer is a different material than the second insulating layer. The method also includes the steps of forming at least one trench in the substrate through the first and second insulating layers, depositing a third insulating layer over the second insulating layer and in the trench wherein the third insulating layer is the same material as the first insulating layer and removing portions of the third insulating layer deposited over the second insulating layer to obtain a planar surface on the second insulating layer. The method additionally includes the steps of anisotropically etching the third insulating layer such that the third insulating layer inside the trench has sidewalls contiguous with the second insulating layer, isotropically etching to remove the sidewalls such that the third insulating layer in the trench is planar with the first insulating layer, and removing the second insulating layer.

In one aspect of the invention, the step of removing the silicon nitride layer includes a step of removal with hot phosphoric acid.

In another aspect, the step of forming a second insulating layer includes a step of depositing silicon nitride.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings.

DETAILED DESCRIPTION OF THE PREFERRED EMBODIMENTS

Figure 1:
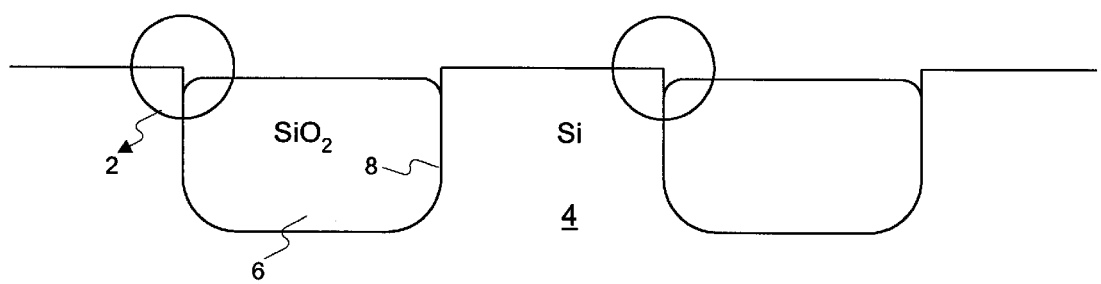
FIG. 1 shows a cross-sectional view of a silicon substrate having microtrenches between STIs and the device substrate.
Figure 2A:
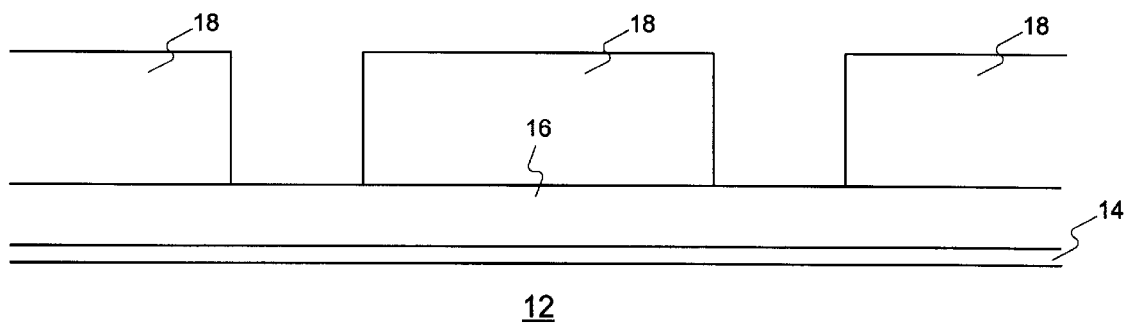
FIGS. 2A–2F are cross-sectional views of the formation of STIs in accordance with the method of the present invention.

A method in accordance with the present invention is explained with reference to FIGS. 2A–2F. Referring to FIG. 2A, a process of the present invention begins by defining a wafer substrate 12. After a first layer of insulating material 14 such as silicon dioxide is grown on substrate 12, a second insulating layer 16 is deposited over insulating layer 14. Insulating layer 16 may be silicon dioxide, silicon nitride or silicon oxynitride, but, for purposes of the present invention, cannot be the same material as insulating layer 14. In a preferred embodiment, insulating layer 14 is silicon dioxide and insulating layer 16 is silicon nitride. A photoresist 18 is then applied over insulating layer 16. Photoresist 18 is patterned to form shallow trenches in substrate 12 through insulating layer 14 and insulating layer 16. Photoresist 18 is then stripped.

Figure 2B:
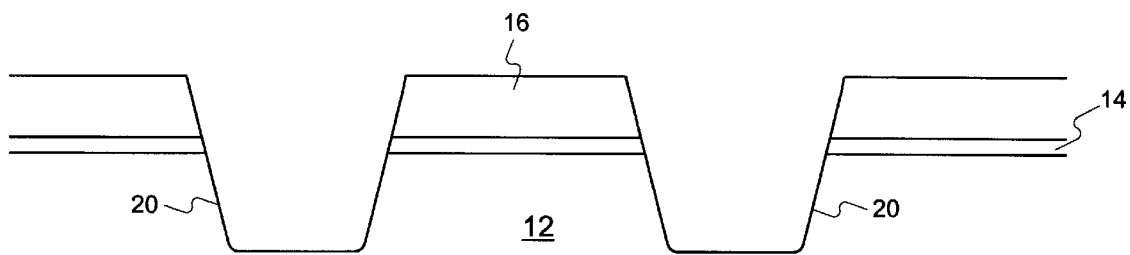
Figure 2C:
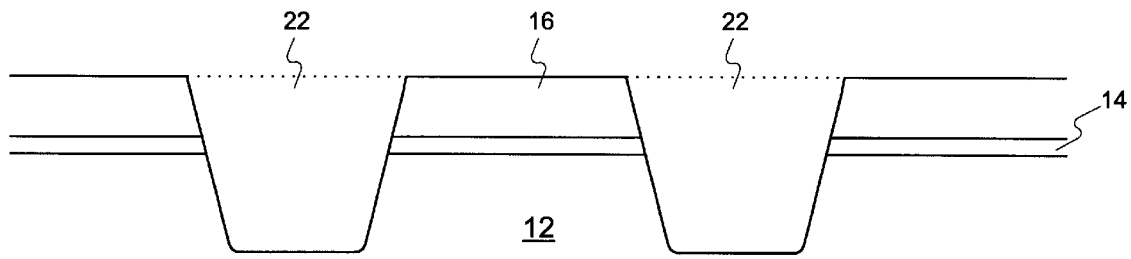

Referring to FIG. 2B, a plurality of shallow trenches 20 are formed in substrate 12 through insulating layers 14 and 16. A third layer 22 of insulating material is then deposited, filling shallow trenches 20 and in the process forming a layer over second insulating layer 16. Third insulating layer 22 is a different material than second insulating layer 16 but is the same material as first insulating layer 14. In a preferred embodiment, third insulating layer 22 is silicon dioxide. As shown in FIG. 2C, third insulating layer 22 deposited over second insulating layer 16 is removed either with CMP or etched back to obtain a planar surface. As a result, third insulating layer 22 fills trenches 20.

Third insulating layer 22, e.g., silicon dioxide, deposited with a conventional "LPCVD" technique is often thicker at the wafer edge and thinner at the center of the wafer as previously described. The subsequent CMP process may be adjusted to produce a substantially planar surface but this process would leave silicon dioxide residue over the second insulating layer at the wafer edge. As discussed above, if the residue is not removed, it acts as a mask and prevent subsequent removal of the second insulating layer. An alternative is to completely remove the deposited silicon dioxide on the wafer edge by excessive polishing or etching, but this will leave a wafer thinner at the center than its edge. For purposes of the present invention, the alternative of leaving a substantially planar surface with silicon dioxide residue over the wafer edge is preferred.

Figure 2D:
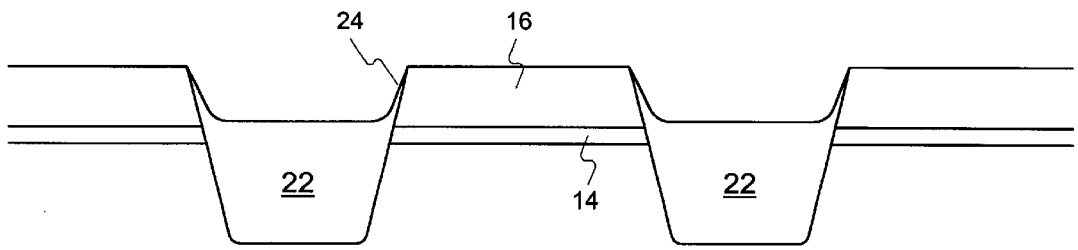

The present invention continues by removing a portion of the third insulating layer remaining in the trenches. By dry etching or anisotropic etching, and with second insulating layer 16 as an etch-stop, the silicon dioxide resides at the wafer edge is removed. As a result, a bowl-shaped third insulating layer 22 remains in the trenches. This is shown in FIG. 2D. The shape of third insulating layer 22 is characterized by sidewalls 24 at the interface between third insulating layer 22 and second insulating layer 16. In a preferred embodiment, sidewalls 24 are contiguous with first and second insulating layers 14 and 16, respectively. If sidewalls 24 are not contiguous with second insulating layer 16 or far exceeds the thickness of second insulating layer 16, non-planar STIs will be formed as a result.

In addition, the anisotropic etch of the present invention may be adjusted such that it has a faster etch rate at the wafer edge than at the wafer center. This adjustment ensures that residues of the third insulating layer on the wafer edge left over after the CMP planarization process will be removed so that they do not impede the subsequent removal of the second insulating layer.

Figure 2E:
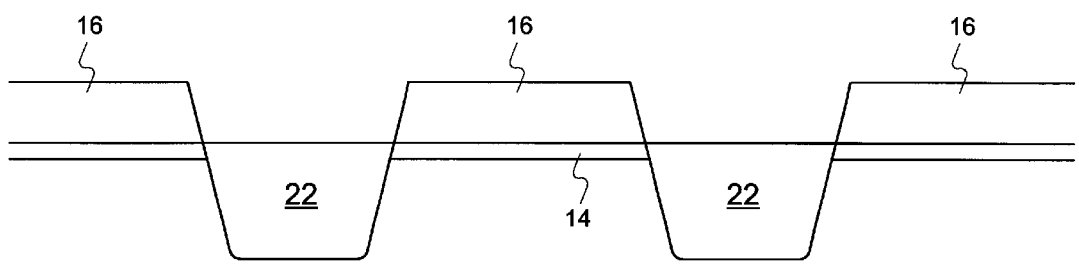

After the anisotropic etch, the method of the present invention continues with isotropic etching to remove sidewalls 24 to obtain a planar surface in the trenches. As shown in FIG. 2E, the remaining third insulating layer 22 is planar with first insulating layer 14. This isotropic etch may be accomplished with BOE. In a final step shown in FIG. 2F, second insulating layer 16 is then removed. If second insulating layer 16 is silicon nitride, hot phosphoric acid $H_3PO_4$ may be used for its removal, leaving a layer of substantially planar surface.

Figure 2F:
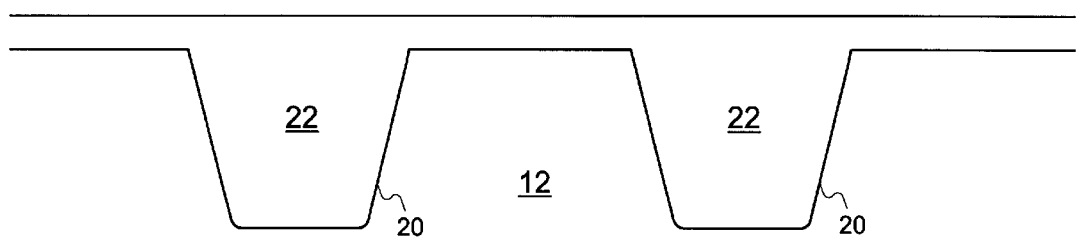

Referring to FIG. 2F, the resulting structure is a semiconductor wafer that includes STIs and a pad oxide on the surface of the wafer. The surface of the wafer is planar. Specifically, substrate 12 includes a plurality of STIs, formed by third insulating layer 22 in trenches 20. The surface of substrate 12 is planar and free of micro-trenches.

It will also be apparent to those skilled in the art that various modifications and variations can be made in the disclosed process and product without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for forming shallow trench isolations, comprising the steps of:

defining a wafer substrate;

forming a first insulating layer on said substrate;

depositing a second insulating layer on said first insulating layer, said first insulating layer being a different material than said second insulating layer;

forming at least one trench in said substrate through said first and second insulating layers;

depositing a third insulating layer over said second insulating layer and in said trench, said third insulating layer being the same material as said first insulating layer;

removing portions of said third insulating layer deposited over said second insulating layer to obtain a planar surface on said second insulating layer;

anisotropically etching said third insulating layer such that said third insulating layer inside said trench has sidewalls contiguous with said second insulating layer;

isotropically etching to remove said sidewalls such that said third insulating layer in said trench is planar with said first insulating layer; and removing said second insulating layer.

2. The method as claimed in claim 1 wherein said step of isotropically etching comprises a step of performing a buffered oxide etch.

3. The method as claimed in claim 1 wherein said step of anisotropically etching comprises a step of etching with a faster etch rate at the edge of said substrate than the center of said substrate.

4. The method as claimed in claim 1 wherein said step of removing said silicon nitride layer comprises a step of removal with hot phosphoric acid.

5. The method as claimed in claim 1 wherein said step of forming a first insulating layer comprises a step of forming a layer of silicon dioxide.

6. The method as claimed in claim 1 wherein said step of forming a second insulating layer comprises a step of depositing silicon nitride.

7. The method as claimed in claim 1 wherein said step of forming a first insulating layer on said substrate comprises a step of forming a layer of silicon dioxide by oxidation.

* * * * *